United States Patent [19]
Nemoto et al.

[11] Patent Number: 5,379,314
[45] Date of Patent: Jan. 3, 1995

[54] SEMICONDUCTOR LASER AND METHOD OF MANUFACTURING SEMICONDUCTOR LASER

[75] Inventors: Kazuhiko Nemoto; Toyoharu Ohata; Masamichi Ogawa, all of Kanagawa, Japan

[73] Assignee: Sony Corporation, Tokyo, Japan

[21] Appl. No.: 138,429

[22] Filed: Oct. 20, 1993

[30] Foreign Application Priority Data

Oct. 20, 1992 [JP] Japan .................. 4-281729

[51] Int. Cl.⁶ .............................................. H01S 3/19
[52] U.S. Cl. ............................................ 372/46; 372/45
[58] Field of Search .............. 372/45, 46, 50; 437/93, 437/905; 257/627, 628

[56] References Cited

U.S. PATENT DOCUMENTS

4,737,961  4/1988  Mori et al. ........................... 372/46
4,932,033  6/1990  Miyazawa et al. ................... 372/46
4,946,802  8/1990  Shima et al. ......................... 372/46
5,093,278  3/1992  Kamei ................................ 372/46
5,111,469  5/1992  Narui et al. ......................... 372/46
5,255,280 10/1993  Harui et al. ......................... 372/45
5,280,493  1/1994  Takiguchi et al. ................... 372/45
5,291,033  3/1994  Morishima ........................... 372/46

*Primary Examiner*—Rodney B. Bovernick
*Assistant Examiner*—Robert E. Wise
*Attorney, Agent, or Firm*—Hill, Steadman & Simpson

[57] ABSTRACT

A light emitting element comprises a substrate having a {100} crystal face having a ridge extending in a <001> crystal axis direction, a first cladding layer formed on the ridge, an active layer formed on the first cladding layer, a second cladding layer formed on the active layer, a first electrode being electrically connected to the substrate, and a second electrode being electrically connected to the second cladding layer.

14 Claims, 11 Drawing Sheets

SEMICONDUCTOR LASER AND METHOD OF MANUFACTURING SEMICONDUCTOR LASER

BACKGROUND OF THE INVENTION

1. Field of the Invention

The present invent[on relates to a light emitting element and a manufacturing method thereof.

2. Description of the Related Art

Semiconductor lasers have heretofore been put into practice as light sources of optical disc, optical fiber communication or the like, and improvements of characteristics such as high coherence, high output and so on are desired. On the other hand, semiconductor lasers are formed as monolithic integrated semiconductors with functional devices such as an optical modulator or the like. In particular, there is a recent demand that semiconductor lasers are formed as two-dimensional integrated semiconductor lasers in a large scale in consideration of a parallel light information processing such as an optical computer or the like and also in consideration of a large capacity parallel light transmission, etc.

Semiconductor lasers of conventional structure cannot be formed as monolithic integrated semiconductor lasers substantially because conventional semiconductor lasers require a cleavage in order to obtain a resonator facet or performance test cannot be made without separation of elements. As semiconductor lasers that can be two-dimensionally integrated in a large scale, a surface emitting type laser which emits a laser beam in the direction perpendicular to the substrate surface receives a remarkable attention.

As a typical arrangement of such surface emitting laser, there is proposed a vertical resonator type surface emitting laser in which a resonator is formed in the direction perpendicular to the substrate surface by laminating a semiconductor layer and a reflection surface on the substrate to thereby emit a laser beam in the vertical direction.

In this case, the resonator is formed in the vertical direction and hence a gain area length is provided in the film thickness direction so that an area that assumes the optical gain is reduced, thereby making it difficult to obtain a high output.

Further, in order to provide a sufficiently low threshold value by forming a distributed reflection type multilayer above and below an active region as a reflector, it is proposed to render this distributed reflection type multilayer a high reflective index of about higher than 95%. However, in this case, since the amount of light emitted to the outside is decreased, such proposed structure cannot be applied to a high output laser substantially. Furthermore, a p-type distributed reflection type multilayer is relatively high in electrical resistance so that a resistance between the elements cannot be reduced without difficulty.

Furthermore, it is frequently observed that a dielectric multilayer is provided as a reflection film, In this case, a manufacturing process becomes complicated and a current injection cannot be made with ease.

On the other hand, as a structure that can obtain sufficiently high output, there is proposed such one that a 45° reflector is formed near the facet of an ordinary horizontal resonator type laser (e.g., J. Kim et al. Appl.- Phys. Lett. 57 (1990), pp. 2048–2050). Although this structure is simple from a theory standpoint, the resonator facet and the 45° external reflector are manufactured by using an etching technique such as RIBE. Therefore, the manufacturing process is complicated and a flatness of the facet and the external reflector and the angle accuracy cannot be controlled without difficulty. There is then the risk that a displacement of an emission angle and an aberration occur.

Furthermore, as another structure that can obtain a sufficiently high output, such an example is reported that, after the ordinary horizontal resonator type laser structure was manufactured, the vertical facet is not formed but an oblique facet is formed as an internal total reflector by the 45° etching process to there! by construct a bend resonator (e.g., N. Hamano et al. Appl. Phys. Lett. 54 (1989), pp. 2389–2391). Even in this structure, the etching technique such as the RIBE or the like is utilized similarly to the above-mentioned external reflector type in the manufacturing process. As a result, a manufacturing process becomes complicated. Also, in this case, there are then the problems of a flatness and angle accuracy of the internal total reflector. Thus, a displacement of an emission angle and an aberration occur.

OBJECTS AND SUMMARY OF THE INVENTION

An object of the present invention is to provide a semiconductor laser which is low in threshold value and high in output.

Another object of the present invention is to provide a semiconductor laser of a surface emitting type which is difficult to cause a displacement of an emission angle and an aberration and a manufacturing method thereof.

Still another object of the present invention is to provide a light emitting element of a so-called double hetero-structure of low threshold value and high output in which a side surface of an active layer is formed separately from other portions by one crystal growth without effecting a dry etching by utilizing the fact that a {110} crystal face having an angle of 45° relative to a major surface of a substrate can be formed under relatively generous growth condition and this side surface is buried to confine a light in the lateral direction of an active layer.

A further object of the present invention is to provide a light emitting element in which an external reflector made of a 45° crystal face is provided in an opposing relation to a light emitting element resonator end face and a light can be produced in the direction perpendicular to a substrate with high accuracy and in which a displacement of a light emitting angle and an aberration can be suppressed.

Yet a further object of the present invention is to provide a manufacturing method of a light emitting element in which when a resonator end face is formed by an etching process in a surface emitting type light emitting element, an etching groove becomes a flat surface and a recrystallization growth is effected on this flat surface to thereby form a 45° external reflector made of a {110} crystal face with high accuracy.

Still a further object of the present invention is to provide a light emitting element in which a resonator is formed as a bend resonator of a U-letter shaped configuration so that a resonator c,f sufficiently large gain area length can be obtained to produce a high gain and in which a confinement in the lateral direction of the active layer is effected to thereby provide a low threshold value and high output.

According to a first aspect of the present invention, there is provided a light emitting element comprises a substrate having a {100} crystal face having a ridge extending in a <001> crystal axis direction, a first cladding layer formed on the ridge, an active layer formed on the first cladding layer, a second cladding layer formed on the active layer, a first electrode being electrically connected to the substrate, and a second electrode being electrically connected to the second cladding layer.

According to a second aspect of the present invention, there is provided a method of manufacturing a light emitting element which comprises the steps of forming a hetero-structure in which an active layer is sandwiched by first and second cladding layers on a substrate having a {100} face having a ridge extending in a <001> crystal axis direction and an etching stop layer, removing the active layer, the first cladding layer, the second cladding layer and the substrate until the etching stop layer is exposed to thereby form a resonation end face, forming a reflector having a {110} face on at least one side of the resonation end face in an opposing relation to the resonation end face, and forming a first electrode being electrically connected to the substrate and a second electrode being electrically connected to the second cladding layer, wherein the active layer and the first and second cladding layers are triangular in cross section and side surfaces of the triangular-shaped portion are formed of {110} crystal face.

In accordance with a third aspect of the present invention, there is provided a light emitting element which comprises a substrate having a {100} crystal face having a ridge extending in a <001> crystal axis direction, a first cladding layer formed on the ridge, an active layer formed on the first cladding layer, a second cladding layer formed on the active layer, a first electrode being electrically connected to the substrate, and a second electrode being electrically connected to the second cladding layer, wherein the ridge has a DBR (Distributed Bragg Reflector) layer and fours surfaces of the first cladding layer, the active layer and the second cladding layer are surrounded by {110} faces.

The above and other objects, features, and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

Initially, action of the present invention will be described hereinafter. In a semiconductor laser according to the present invention, a ridge 2 extending in the <001> crystal axis direction is formed on a major surface 1S made of a {100} crystal face of a semiconductor substrate 1, on which a semiconductor layer is formed to construct a semiconductor laser. According to the above-mentioned structure, study and research of the assignee of the present application revealed that the {110} crystal face could be extended and obtained from the side portion of the ridge 2 spontaneously.

Figure 1:
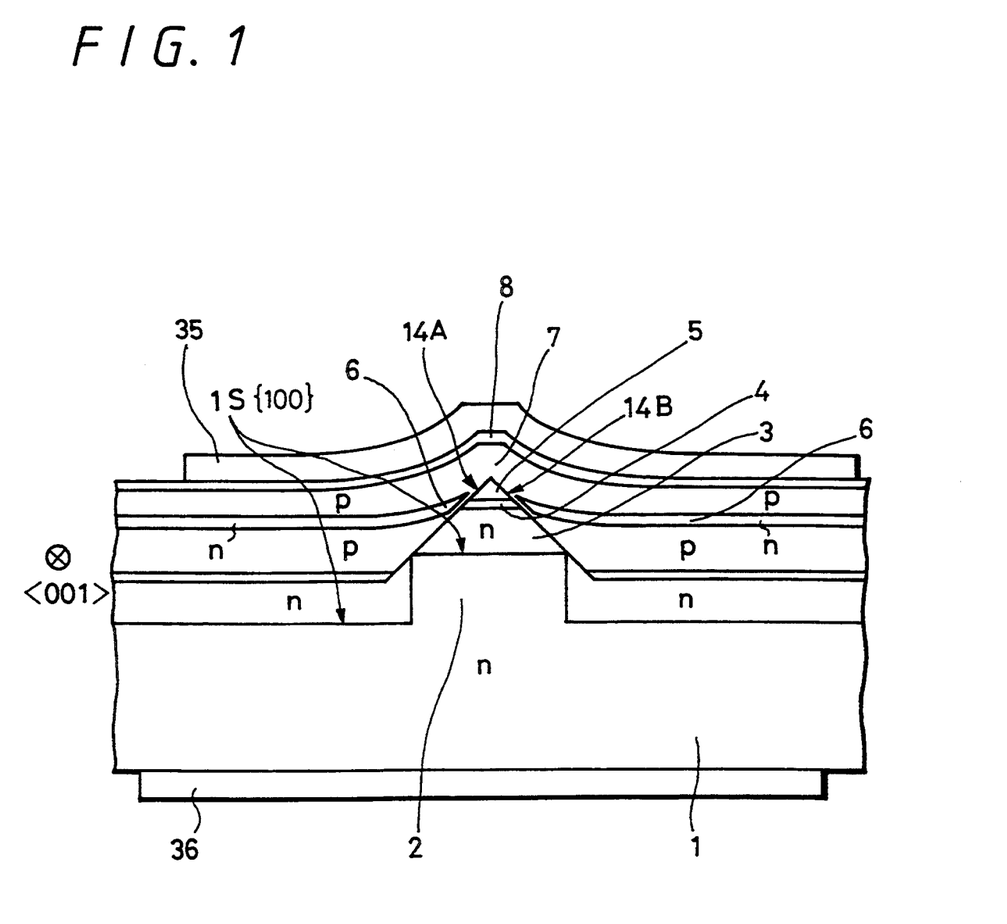
FIG. 1 is a schematic cross-sectional view showing a semiconductor laser according to an embodiment of the present invention in an enlarge scale.

More specifically, as shown in FIG. 1, when the {110} crystal face is produced from the side portion of the ridge 2 extending in the <001> crystal axis direction, an epitaxial growth speed is very slow on the {110} crystal face with the result that a semiconductor layer formed thereon, i.e., both sides of a first cladding layer 3, an active layer 4 and a second cladding layer 5 are encircled by side faces 14A, 14B made of the {110} crystal face and the cross section thereof is grown in a substantially triangular shape. When the epitaxial growth process is carried out thereafter, the side faces 14A, 14B cross each other and then grown wholly. Accordingly, by covering both side faces of the active layer 4 on the ridge 2 with buried layers having a band gap lager than that of the active layer 4, a semiconductor laser in which a so-called lateral direction confinement perpendicular to the resonator direction is made and which is high in output and low in threshold value can be obtained by one crystal growth.

Further, according to the present invention, in the arrangement shown in FIG. 1, a resonator end face 9 of the active layer 4 is formed by the etching process and an external reflector 24 formed of the {110} crystal face is provided in an opposing fashion to the resonator end face 9. Accordingly, it is possible to construct the semiconductor laser of surface emitting type of high output and low threshold value.

Figure 2:
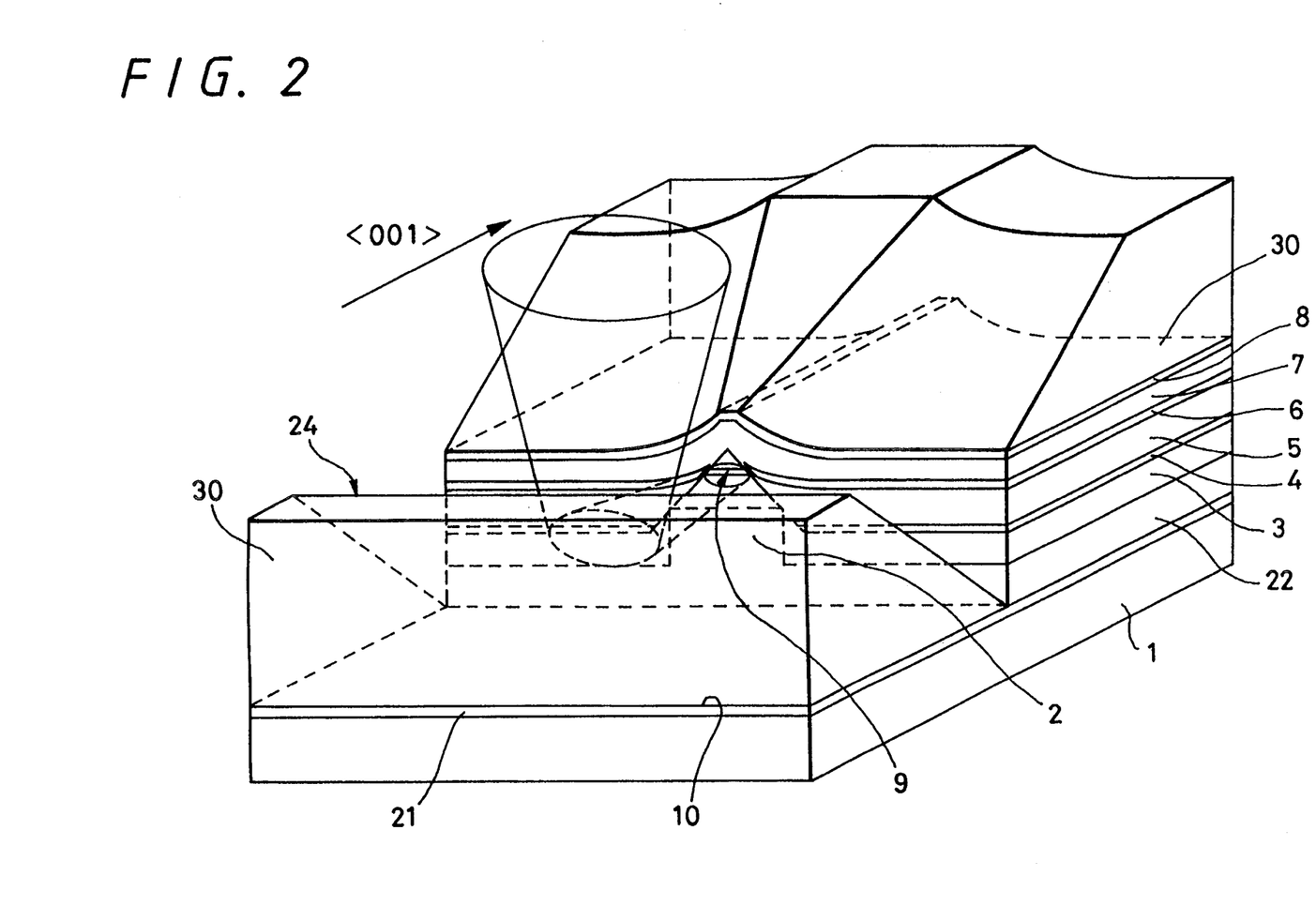
FIG. 2 is a schematic perspective view showing the semiconductor laser according to the present invention in an enlarged scale.

As shown in FIG. 2, an etching preventing layer 21 is formed in advance on the semiconductor substrate 1 on which the semiconductor laser of the structure similar to that of FIG. 1 is formed, whereafter the resonator end face 9 is formed by the etching process whose depth reaches the etching preventing layer 21. In this case, a flat face can be obtained in an opposing relation to the resonator end face 9 independently of the concave and convex portions on the upper surface of the semiconductor laser. Therefore, an external reflector 24 can be obtained by one etching process and recrystallization.

Further, according to the present invention, since a flat portion 12 which is flush with the upper surface of the ridge 2 is formed in the extending direction of the ridge 2 and then the respective layers 2 to 4 are formed, the upper surface of this crystal growth layer becomes a flat surface. When a flat portion 13 and the resonator end face 9 are formed by etching the crystal growth layer on the flat surface 12 and a recrystallization growth is effected on this flat surface portion 13 as it is, the external reflector 24 formed of the {110} crystal face can be formed.

As described above, according to the present invention, the side faces 14A and 14B of the active layer 4 can be formed without the active layer 4 being damaged independently of the dry etching process such as RIE or the like. Further, since the external reflector 24 is formed by the crystal growth face, the accurate 45° mirror surface can be obtained, thereby considerably suppressing the displacement of the emitting angle and the occurrence of aberration or the like.

In a semiconductor laser according to the present invention, on a semiconductor substrate having a distributed reflection multilayer is formed a ridge extending in the <001> crystal axis direction on which there are formed at least the first cladding layer 3, the active layer 4 and the second cladding layer 5. The assignee of the present application has previously proposed the surface emitting type semiconductor laser thus arranged as Japanese patent application No. 4-262259. This semiconductor laser of the surface emitting type will be described below.

Figure 3:
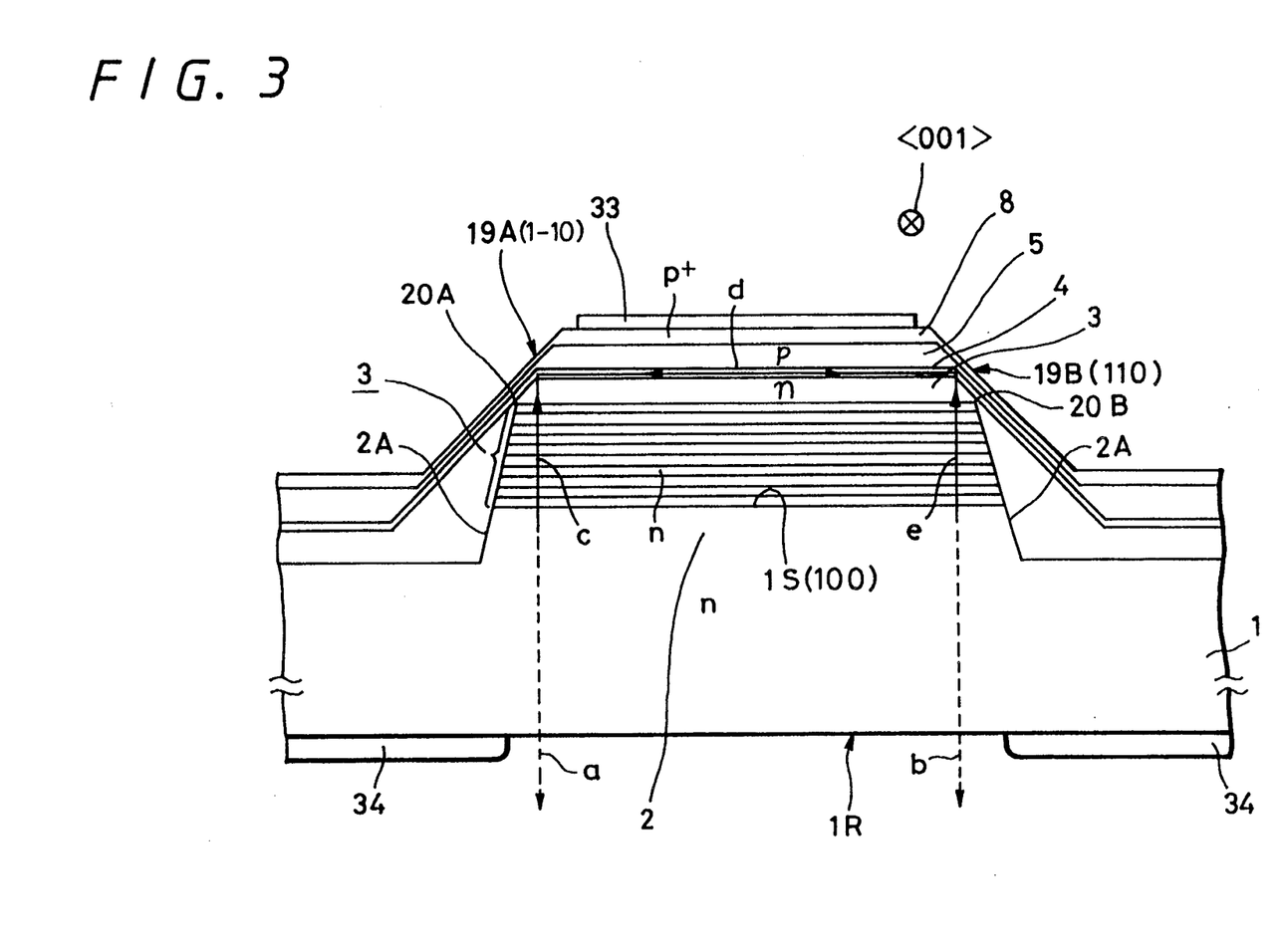
FIG. 3 is a schematic cross-sectional view of the semiconductor laser according to the embodiment of the present invention in an enlarged scale.

As shown in FIG. 3 which is a schematic enlarged cross-sectional view, in this semiconductor laser, the ridge 2 extending in the <001> crystal axis direction is formed on the semiconductor substrate 1 having a distributed reflection type multilayer 32. On the ridge! 2, there are epitaxially grown the first cladding layer 3, the active layer 4, the second cladding layer 5 and a capping layer 8, thereby side faces 19A and 19B extending from side portions 20A and 20B of the ridge 2 being formed of the {110} crystal face. An oscillation light in the active layer 4 as shown by an arrow d in FIG. 3 is reflected toward the substrate 1 by the side faces 19A and 19B serving as the reflection surface. Further, the oscillation light is reflected on a distributed reflection type multilayer 32 and is again introduced through both side surfaces 19A and 19B of the active layer 4 into the active layer 4 as shown by arrows c and e of FIG. 3. Accordingly, this semiconductor laser constructs a bend resonator of a U-letter configuration to obtain a sufficient gain so that a laser beam is emitted to a rear surface 1R side of the substrate 1 as shown by broken lines a and b in FIG. 3. In FIG. 3, reference numerals 33 and 34 denote electrodes, respectively.

As described above, this semiconductor laser is formed as the bend resonator configuration. Therefore, it is possible to avoid such disadvantage that the film thickness is increased because the length of the resonator is increased as in the vertical resonator type semiconductor. Accordingly, the resonator having a sufficiently large gain area length can be obtained to produce a high gain. Thus, this semiconductor laser can provide a low threshold value and a high output.

Figure 4:
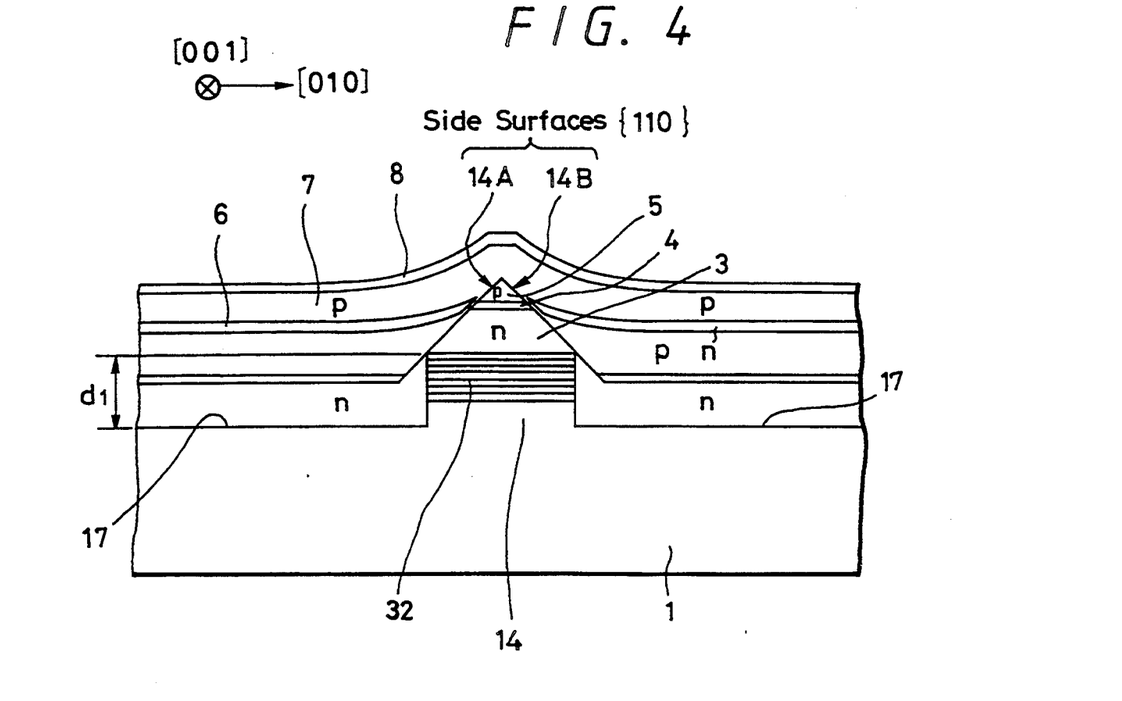
FIG. 4 is a schematic cross-sectional view of the semiconductor laser according to the embodiment of the present invention in an enlarged scale.
Figure 5:
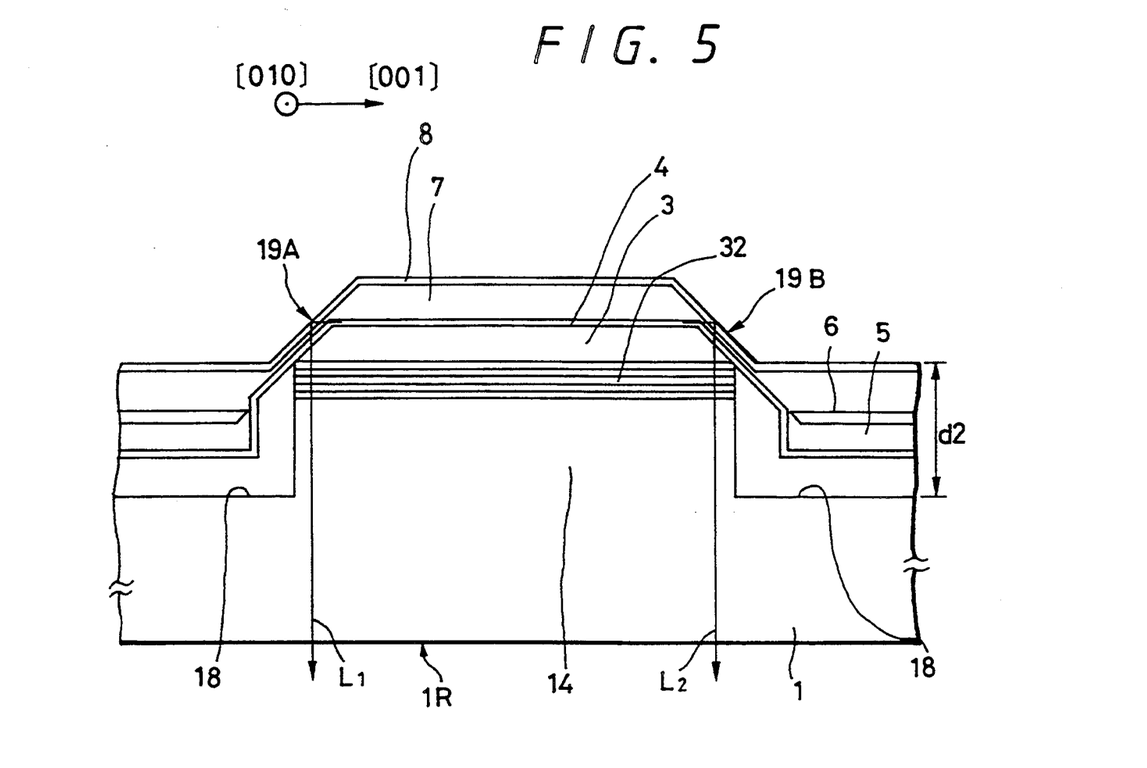
FIG. 5 is a schematic cross-sectional view of the semiconductor laser according to the embodiment of the present invention.

Particularly, according to the present invention, on the substrate 1 on which the distributed reflection type multilayer 32 is formed, there are formed a first ridge 14 extending in the <011> crystal axis direction and second and third ridges 15, 16 communicated with both ends and extending in the direction perpendicular to the extending direction of the ridge 14 such that their upper surfaces become flush with each other. A groove 17 sandwiched by both sides of the first ridge 14 and the second and third ridges 15, 16 are made shallow as compared with a groove 18 on the outside of the second and third ridges 15, 16, on which there are formed at least the first cladding layer 3, the active layer 4 and the second cladding layer 5., In this case, as shown in FIG. 4, even when the crystal growth is carried out until both side surfaces 14A, 14B formed of the {110} crystal face of the first ridge 14 are buried, they can be prevented from being buried into other layers in the side surfaces 19A, 19B as shown in FIG. 5. Then, the side surfaces 19A, 19B are retained as satisfactory reflection surfaces by increasing a refractive index difference between the outside and the semiconductor layer. Therefore, according to the present invention, it is possible to obtain the surface emitting type semiconductor laser which is low in threshold value and high in output.

Embodiments of the present invention will hereinafter be described with reference to the accompanying drawings. In these embodiments, there was used the semiconductor substrate 1 in which the ridge 2 extending in the <001> crystal axis direction, e.g., [001] crystal axis direction is formed on the major surface 1S formed of the (100) crystal face of, for example, the {100} crystal face. Then, on the semiconductor substrate 1, there are epitaxially grown the first cladding layer 3, the active layer 4, the second cladding layer 5, a current blocking layer 6, a third cladding layer 7 and the capping layer 8 by an atmospheric pressure MOCVD (metal organic chemical vapor deposition) process. In this case, as the epitaxial material, there was used a methyl-based material such as AsH$_3$, trimethyl gallium TMG, trimethyl aluminum TMA or the like. The epitaxial growth was carried out under the condition that an atomic number ratio of 5-family atom and 3-family atom. i.e., V/III ratio was selected to be greater than 50, for example, 87 and that the growing speed was selected to be less than several 10s of Angstroms/s, for example, 10Å/s.

Figure 6:
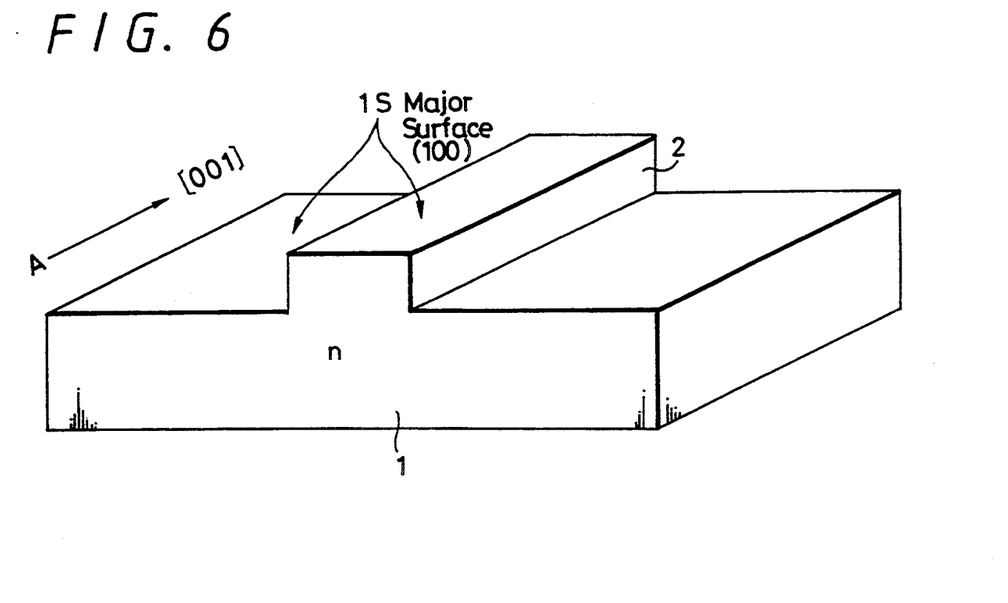
FIG. 6 is a manufacturing process diagram of the semiconductor laser according to the embodiment of the present invention.

When the semiconductor laser shown in FIG. 1 was manufactured, as shown in FIG. 6, on the major surface 1S of the compound semiconductor substrate 1 such as n-type GaAs is formed the ridge 2 extending in the [001] crystal axis direction as shown by an arrow A by an anisotropy etching process such as RIE or the like. Then, the first cladding layer 3 made of n-type AlGaAs or the like, the active layer 4 made of GaAs or the like, the second cladding layer 5 made of p-type AlGaAs or the like, the current blocking layer 6 made of n-type AlGaAs or the like, the third cladding layer 7 made of p-type AlGaAs or the like and the capping layer 8 made of p-type AlGaAs having a concentration higher than that of the second cladding layer 5 are epitaxially grown so as to cover the ridge 2.

At that time, in the first cladding layer 3, the active layer 4 and the second cladding layer 5 on the ridge 2, if the {110} crystal face is grown from the side portion extending along the [001] crystal axis direction of the ridge 2, then the epitaxial growth speed becomes extremely low. Accordingly, as shown in FIG. 1, both side surfaces 14A and 14B are formed of the {110} crystal face extending in the <001> crystal axis direction.

By properly selecting the height of the ridge 2 and the thicknesses of the respective layers 3, 4, 5 and 6, the current blocking layer 6 can abut against the two side surfaces 14A, 14B of the active layer 4. In this case, the side surface 14A becomes a (1–10) face and the side surface 14B becomes a (110) face.

Thereafter, electrodes 35, 36 are respectively deposited on the capping layer 8 and the rear surface of the substrate 1, thereby obtaining the semiconductor laser of the present invention. In this case, a light confinement is carried out in the lateral direction of the active layer 4. Also, p-n-p-n thyristor is constructed at both sides of the active layer 4, thereby effecting a satisfactory carrier confinement. Therefore, it is possible to obtain the semiconductor laser of low threshold value and high output.

As the semiconductor laser in which a hetero-structure is obtained by one crystal growth, a so-called SDH (Separated Double Hetero-junction laser) was reported, in which a ridge extending in <011> crystal axis direction is formed on a substrate formed of, for example, {100} crystal face and the epitaxial growth is carried out to restrict the growth on the ridge by an inclined plane formed of a {111} crystal face to thereby effect the lateral direction confinement (e.g., H. Narui et al. 12th IEEE International Semiconductor Laser Conference (September 1990 in Switzerland) paper F-1 (p.78).

In the present invention, the inclined plane is not formed of {111}B crystal face but is formed of {110} crystal face. Therefore, according to the present invention, there is then the advantage that the 45° external reflector can be formed by crystal growth by effectively utilizing this inclined plane as will be described in the embodiments below. In this case, substantially no restriction is imposed on the growth conditions and the semiconductor laser can be constructed under the conditions similar to those of the ordinary semiconductor laser.

An example in which an external reflector formed of {110} crystal face is provided in an opposing relation to the resonator end face of this semiconductor laser will be described in detail.

Figure 7:
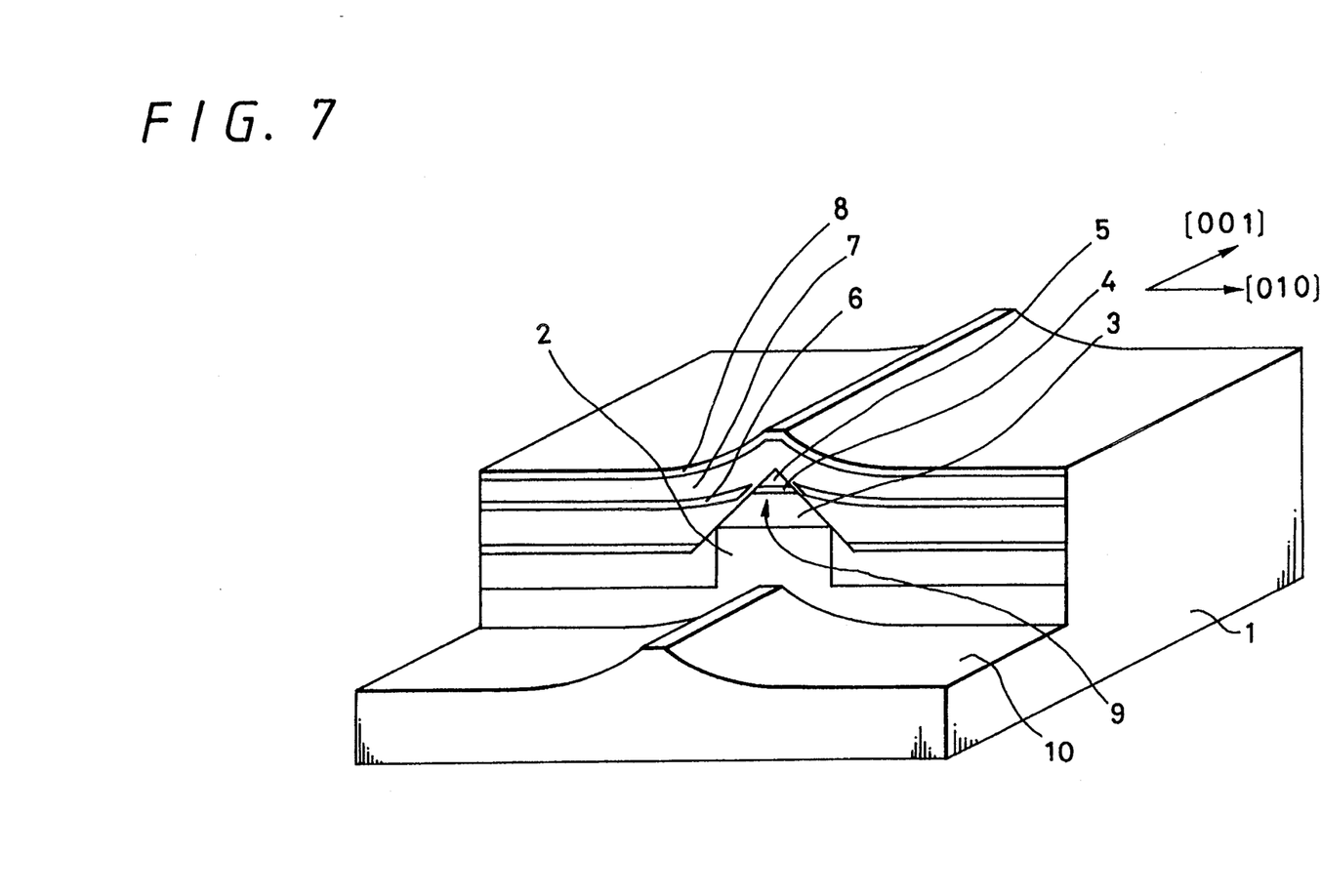
FIG. 7 is a manufacturing process diagram of an example of a comparative semiconductor laser.
Figure 8:
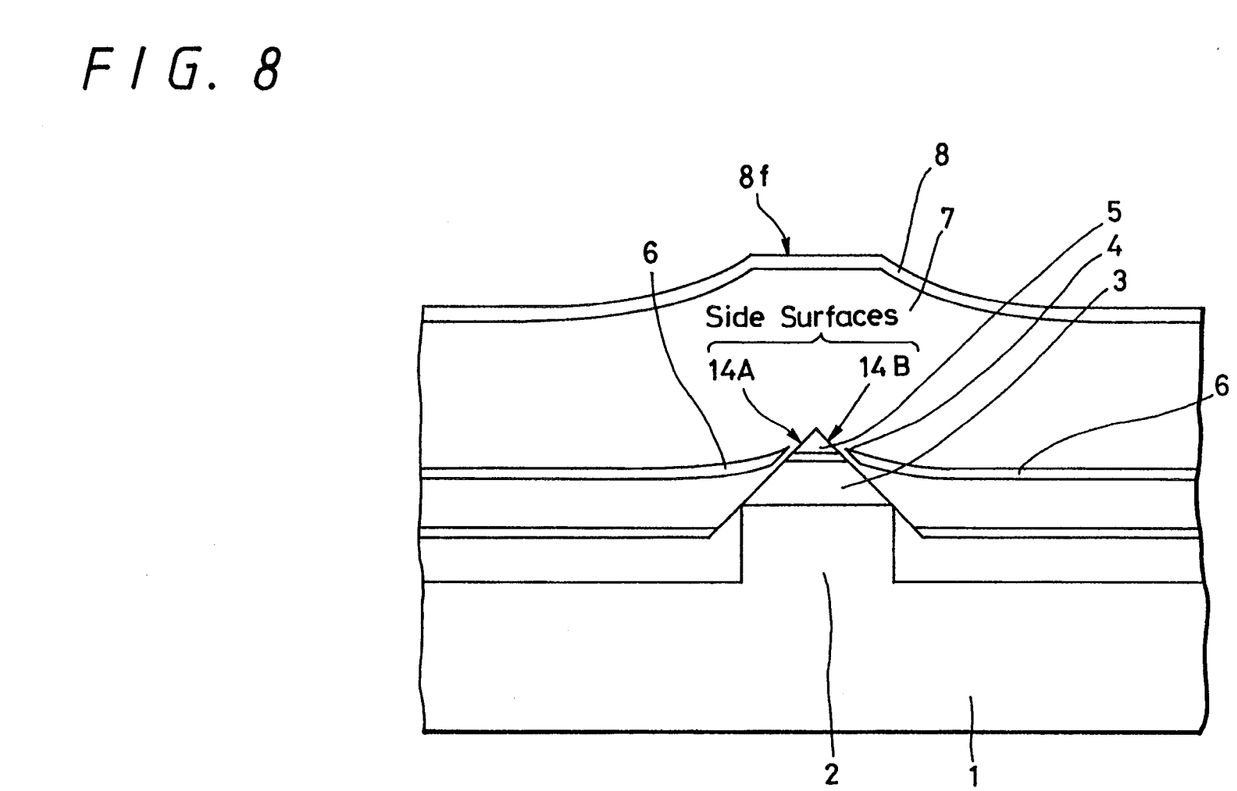
FIG. 8 is a manufacturing process diagram of an example of a comparative semiconductor laser.

With the above-mentioned arrangement, when the resonator end face is formed by the anisotropy etching process such as the RIE or the like, as, for example, shown in FIG. 7, the etching is carried out while the concave and convex portions on the surface of the capping layer 8 are maintained. Consequently, even when the recrystallization is carried out on the groove 10 formed by this etching, the 45° external reflector cannot be formed. FIG. 8 shows an example that the capping layer 8 is accumulated to be thick to the extent that a flat surface 8f is formed on the surface of the capping layer 8. Since this flat portion is large as compared with the width of the active layer 4, the etching groove can be flattened by etching this flat portion. In this case, there is then the disadvantage that the thickness of the capping layer 8 must be increased considerably. In FIGS. 7 and 8, like parts corresponding to those of FIG. 1 are marked with the same references and therefore need not be described in detail.

Figure 9:
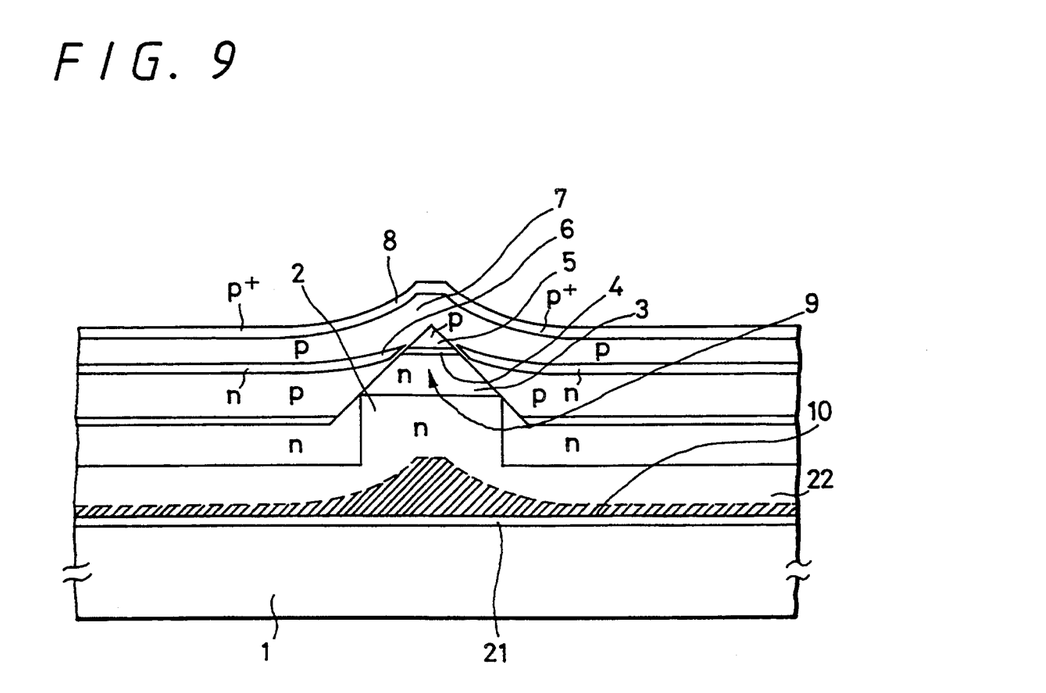
FIG. 9 is a manufacturing process diagram showing the semiconductor laser according to the embodiment of the present invention.

In the present invention, as shown in a process diagram forming FIG. 9, on the semiconductor substrate 1 is formed an etching stop layer 21 made of, for example, AlGaAs or the like having an etching selection property with the material of the substrate 1. Thereafter, a semiconductor layer 22 made of the same material as that of the substrate 1 made of n-type GaAs is epitaxially grown on the etching stop layer 21. On the semiconductor layer 22 is formed the ridge 2 extending in the {001} crystal axis direction of the <001> crystal axis similarly to the above-mentioned example. Then, the first cladding layer 3 made of n-type AlGaAs or the like, the active layer 4 made of GaAs or the like, the second cladding layer 5 made of p-type AlGaAs or the like, the current blocking layer 6 made of n-type AlGaAs or the like, the third cladding layer 7 made of p-type AlGaAs or the like and further the capping layer 8 made of p-type GaAs or the like in which impurities of high concentration are doped are epitaxially grown by some suitable process such as the MOCVD or the like.

Thereafter, by the anisotropy etching process such as the RIE or the like, the etching whose depth reaches the etching stop layer 21, for example, is carried out to thereby construct a flat groove 10 as shown in FIG. 9. In this case, a non-selective dry etching is carried out in the initial stage, whereafter the etchant is switched and the selective-dry etching is carried out. By the non-selective etching, the etching is carried out following the concave and convex portions on the surface of the capping layer 8 as shown by a broken line in FIG. 9. Thereafter, when the selective-etching is carried out, the etching is blocked by the etching stop layer 21, and an area encircled by this layer 21 and an area shown hatched is etched away. As a result, the groove 10 can be constructed as the flat surface.

In this case, the end face of the active layer 4 thus etched is constructed as a resonator end face 9 extending along the [010] crystal axis direction of the <001> crystal axis direction, on which a dielectric protecting film, not shown, is deposited and a recrystallization of a semiconductor layer 30 made of GaAS or the like is carried out. At that time, as shown in FIG. 2, the (101) crystal face of the {110} crystal face is spontaneously grown from the end portion of the end face 9. Therefore, the external reflector 24 having an angle of 45° relative to the major surface 1S of the substrate 1 can be formed in an opposing relation to the resonator end face 9. In FIG. 2, like parts corresponding to those of FIG. 9 are marked with the same references and therefore need not be described in detail.

The method in which the etching block layer is provided as described above is not limited to the case that the external reflector is provided and can be widely applied as a method of obtaining the flat bottom surface by effecting the dry etching on other substrate and element having the concave and convex portions.

Figure 10:
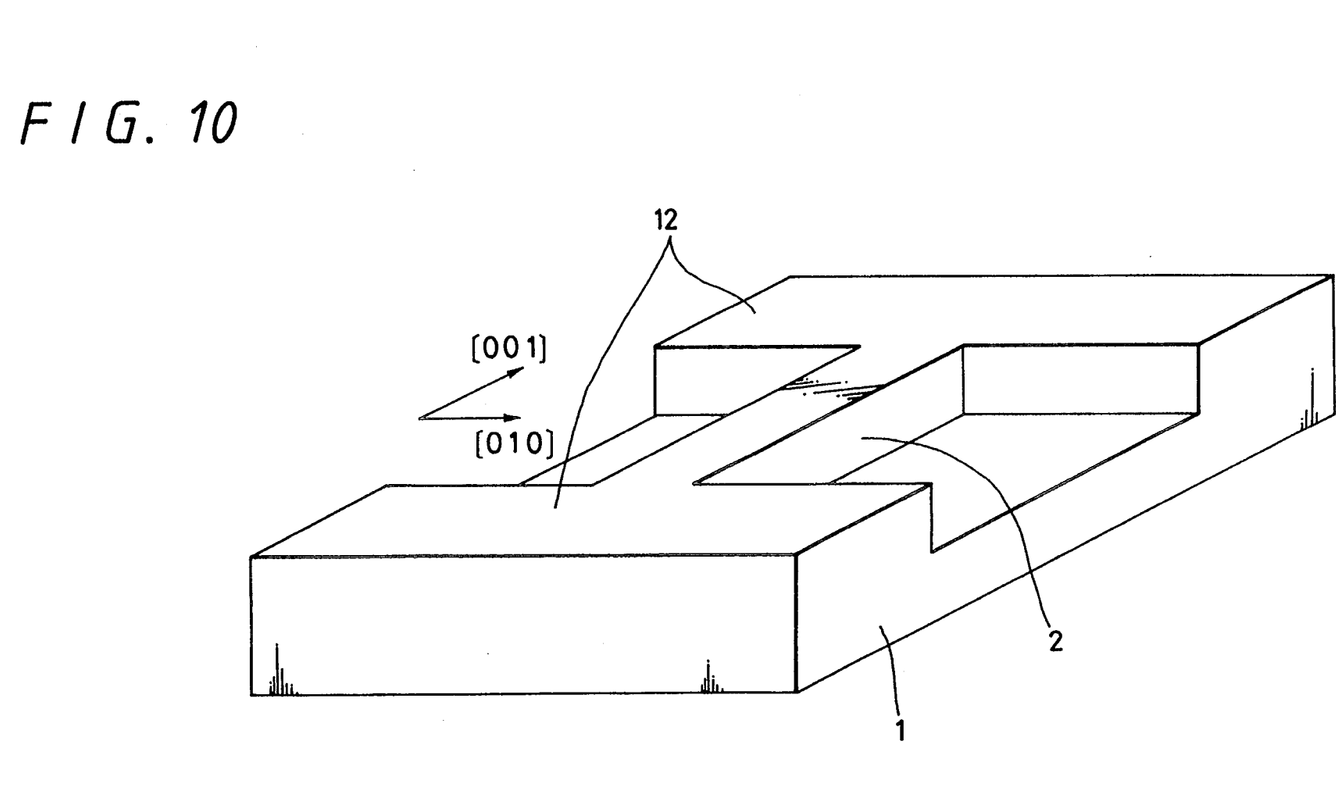
FIG. 10 is a manufacturing process diagram showing a manufacturing method of a semiconductor laser according to the embodiment of the present invention.
Figure 11:
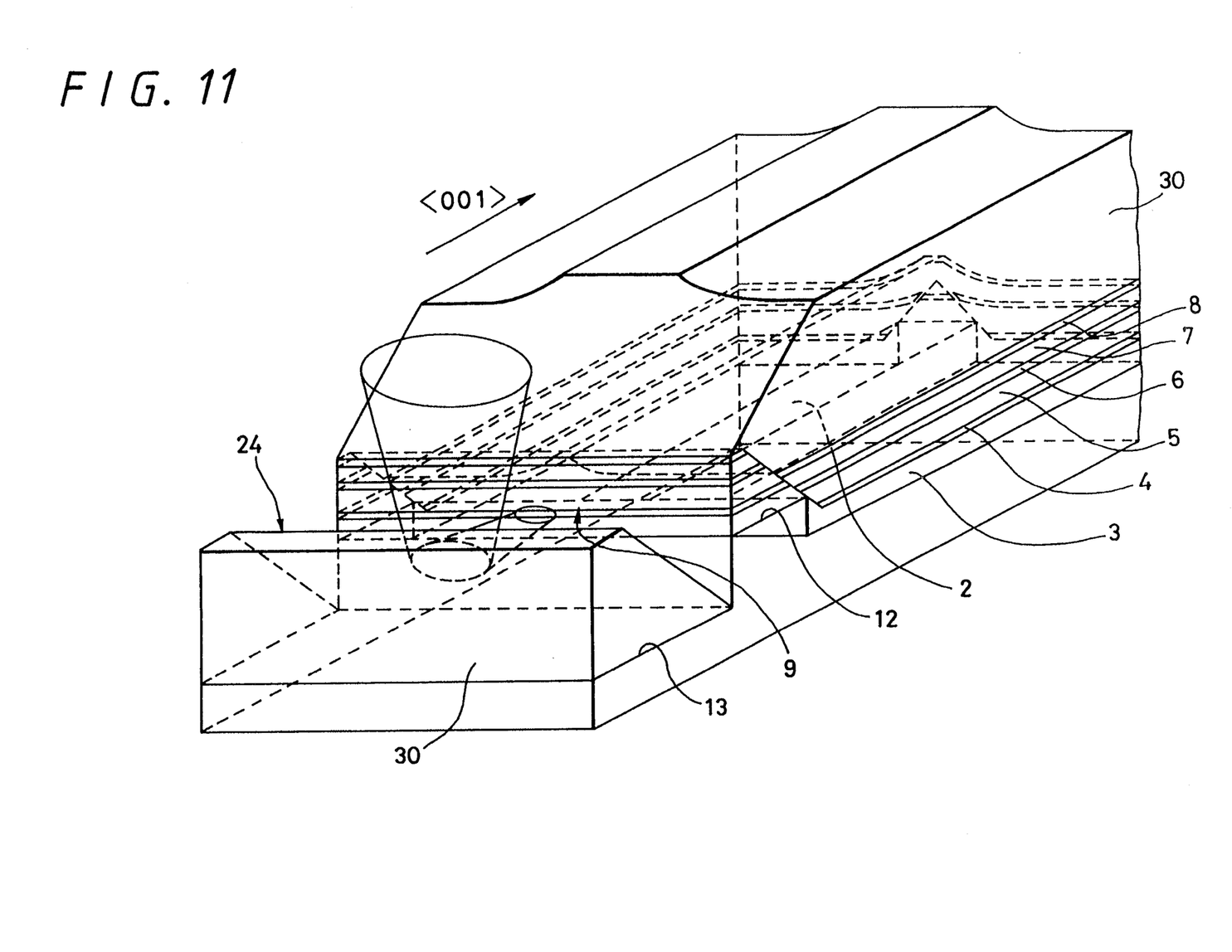
FIG. 11 is a manufacturing process diagram showing a manufacturing method of a semiconductor laser according to the embodiment of the present invention.

A manufacturing method of obtaining a flat surface will be described with reference to FIGS. 10 and 11. In this embodiment, as shown in FIG. 10, on the semiconductor substrate 1 using the {100} crystal face as the major surface 1S thereof are formed the ridge 2 extending in the <001> crystal axis direction and the flat surface portion 12 which is flush with the upper surface of the ridge 2 in its extended portion. Thereafter, as shown in FIG. 11, on the whole surface are formed the first cladding layer 3 made of n-type AlGaAs or the like, the active layer 4 made of GaAs or the like, the second cladding layer 5 made of p-type AlGaAs or the like, the current blocking layer 6 made of n-type AlGaAs or the like, the third cladding layer 7 made of p-type AlGaAs or the like and the capping layer 8 made of p-type GaAs or the like by some suitable process such as MOCVD or the like.

Figure 12:
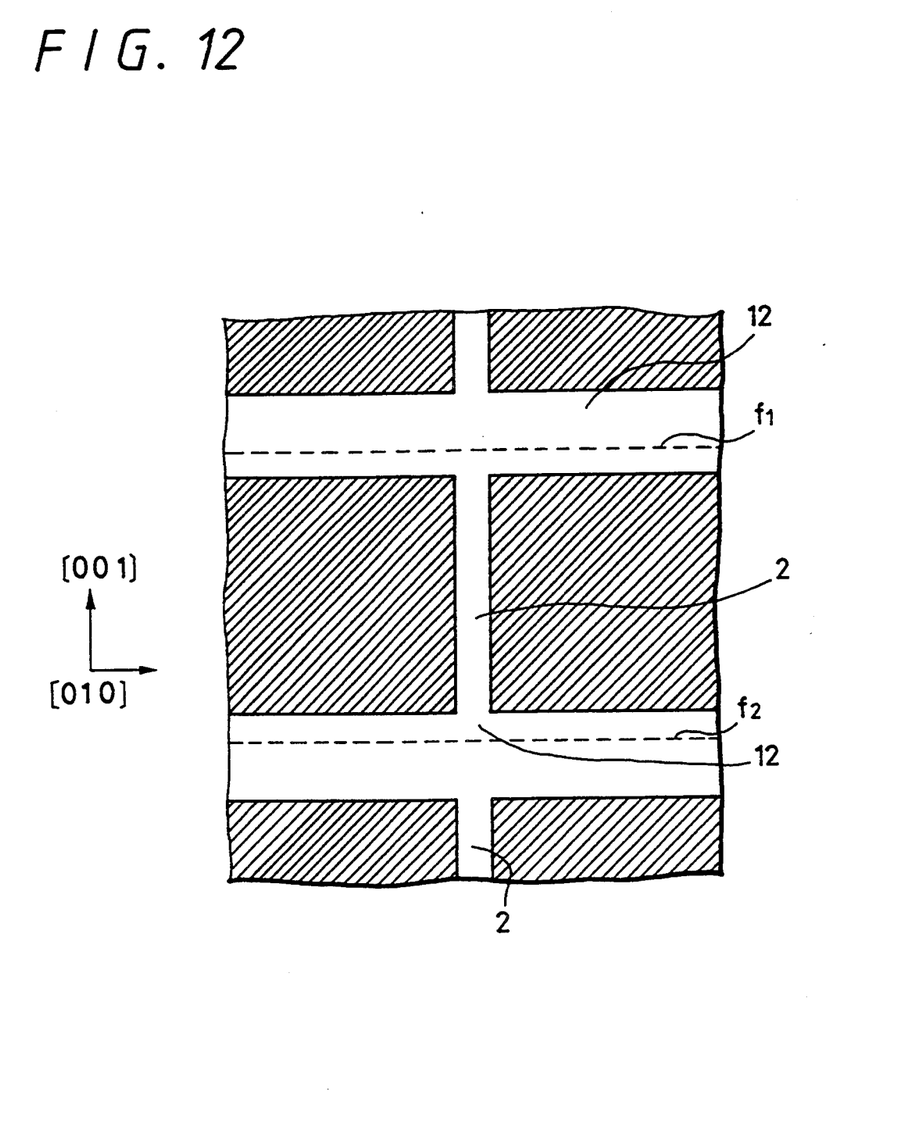
FIG. 12 is a manufacturing process diagram showing the semiconductor laser according to the embodiment of the present invention.

In this case, on the ridge 2 is epitaxially grown both side surfaces of substantially triangular cross section by the restriction of the {110} crystal face. However, the respective layers are formed on the flat surface portion 12 in an planar fashion and the surface thereof becomes flat surface. Then, as shown in FIG. 12, in the extended portion that is extended from the ridge 2 on the flat surface portion 12 as shown by broken lines f1 and f2, the crystal growth layer on the flat surface portion 12 extended along the (010) crystal axis direction of the <001> crystal axis is etched to thereby form a flat surface portion 13 and also the resonator end face 9 is formed by the etching process as shown in FIG. 11. Thereafter, the semiconductor layer 30 made of GaAs or the like is epitaxially grown on the flat surface portion 13 and the external reflector 24 made of the {110} crystal face can be formed in an opposing relation to the resonator end face 9 similarly to the example shown in FIG. 2.

With the above-mentioned arrangement, the active layer on the plane portion 12 becomes wide as compared with the area of triangular cross section formed on the ridge 2, thereby constructing a so-called window structure. Therefore, light density in the resonator end face 9 can be reduced, which is advantageous in enabling the semiconductor laser to produce high output.

The surface emitting type semiconductor laser in which a bend resonator having a U-letter configuration is formed by the distributed reflection type multilayer according to other embodiment of the present invention will be described with reference to FIGS. 4, 5 and 13.

In this embodiment, there is prepared the semiconductor substrate 1 made of n-type GaAs in which the distributed reflection type multilayer is formed in advance. This distributed reflection type multilayer is formed by alternately laminating wholly n-type GaAS and n-type AlGaAs on the semiconductor substrate at its major surface 1S made of {100} crystal face, e.g., (100) crystal face according to some suitable process such as the MOCVD process or the like.

Figure 13:
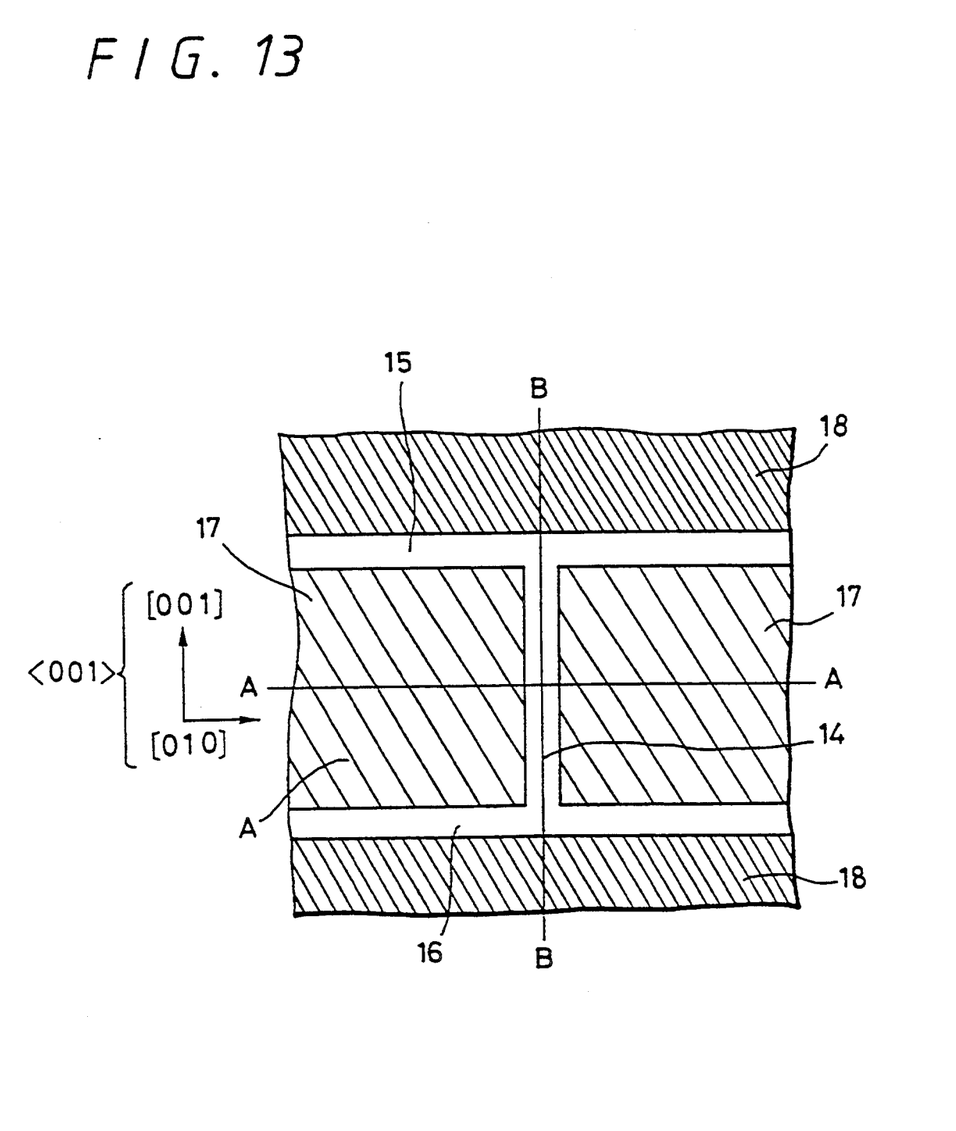
FIG. 13 is a manufacturing process diagram showing the semiconductor laser according to the embodiment of the present invention.

Thereafter, as shown in FIG. 13, a first ridge 14 extending in the <001> crystal axis direction, e.g., [001] crystal axis direction and second and third ridges 15, 16 communicated with respective ends of the first ridge 14 and which are extended in the direction perpendicular to the extending direction of the first ridge 14 are processed by the patterning treatment. The second and third ridges 15, 16 are made flush with the upper surface of the first ridge 14. Thereafter, a groove 17 sandwiched by the second and third ridges 15, 16 at both sides of the first ridge 14 are made shallow as compared with a groove 18 formed outside of the second and third ridges 15, 16 by the etching process of two stages.

Then, on the whole surface including the upper portions of the first, second and third ridges 14, 15 and 16 are formed the first cladding layer 3 made of n-type AlGaAs or the like, the active layer 4 made of GaAs or the like, the second cladding layer 5 made of p-type AlGaAs or the like, the current blocking layer 6 made of n-type AlGaAs or the like, the third cladding layer 7 made of p-type AlGaAs or the like and the capping layer 8 made of p-type GaAs or the like in which impurities of high concentration are doped by the MOCVD process, in that order.

FIG. 4 is a cross-sectional view taken along the line A—A in FIG. 13. The two side surfaces 14A and 14B extended in the direction along the first ridge 14 of the active layer 4 on the first ridge 14 are constructed by the {110} crystal face similarly to the above-mentioned respective embodiments, In this case, the side surface 14A becomes a (1-10) crystal face and the side surface 14B becomes a (110) crystal face.

Depths of the grooves 17 at both sides of the ridge 14 and thicknesses of the respective layers 3 to 6 are properly selected such that the current blocking layer 6 abuts against the two side surfaces 14A, 14B of the active layer 4. Thus, the lateral direction confinement is carried out satisfactorily in the active layer 4. In this embodiment, a depth d1 of the groove 17 from the upper surface of the ridge 14 is selected in a range of from 2.5 to 3 μm.

Further, at that time, the p-n-p-n thyristor is constructed at both sides of the first ridge 14. Hence, a satisfactory carrier confinement can be carried out and the semiconductor laser of low threshold value and high output can be obtained.

FIG. 5 is a cross-sectional view taken along the line B—B in FIG. 13. both side surfaces extending in the [010] crystal axis direction along the second and third ridges 15, 6, i.e., resonator end faces 19A, 19B are constructed by the {110} crystal face similarly to the above-mentioned respective embodiments. In this case, the side surface 19A becomes a (10-1) crystal face and the side surface 19B becomes a (101) crystal face.

At that time, the groove 18 outside of the first ridge 14 is formed deep as compared with the groove 17. The upper surfaces of the respective layers epitaxially grown on the groove 18, i.e., the upper surface of the capping layer 18 is formed at the low position as compared with the position at which the active layer 4 is formed on the ridge 14. A depth d2 of the groove 18 from the upper surface of the ridge 14 is selected in a range of from about 5 to 7 μm, for example.

Further, when the groove 18 is formed by the isotropy etching process, the side surface on the ridge side becomes gentle and an epitaxial growth layer on the groove is grown at relatively high speed so that the above depth d2 must be selected to be larger, e.g., in a range of from 8 to 9 μm.

With the above-mentioned arrangement, the two side surfaces 19A, 19B of the active layer 4 on the ridge 14 in the resonator length direction are prevented from contacting with the buried layer and hence, the oscillation light from the active layer 4 can be reflected satisfactorily on this portion. At that time, the respective two side surfaces 19A, 19B are crystal surfaces which form an angle of 45° relative to the major surface is of the substrate 1. A light of high reflectivity is traveled toward the distributed reflection type multilayer 32 of the substrate 1, wherein it is reflected and returned into the active layer 4 through the two side surfaces 19A, 19B, thereby constructing the bend resonator of a U-letter configuration.

Thereafter, on the capping layer 8 and the rear surface 1R of the substrate 1 are deposited metal layers made of a material such as AuZn or the like, for example, in a predetermined pattern by an evaporation, photolithography or the like to thereby form electrodes 33, 34. Thus, the semiconductor laser of the present invention can be obtained. By conducting these electrodes 33 and 34 by a predetermined current, a laser oscillation can be produced on the rear surface 1R side of the substrate 1 as shown by arrows L1 and L2 in FIG. 5.

Incidentally, when the active layer 4 is made of InGaAs, the band gap thereof becomes small as compared with the band gap of the substrate 1 made of GaAs so that the oscillation light on the active layer 4 is not absorbed in the substrate 1 and emitted to the outside. Further, when the oscillation wavelength is net transparent relative to the substrate 1, an output light may be obtained by etching the substrate 1 up to the distributed reflection type multilayer 32 from the rear surface 1R side.

With the above-mentioned arrangement, since the semiconductor laser is adapted to have the bend resonator configuration, a sufficiently high gain can be obtained without increasing the reflectivity of the distributed reflection type multilayer so much. Further, since the resonator is constructed by providing the distributed reflection type multilayer 2 on the substrate 1 side of the active layer 4, the surface emitting laser can be constructed by only the n-type distributed reflection type multilayer. Therefore, a high resistance provided by a p-type distributed reflection type multilayer can be avoided and the semiconductor laser of low threshold value and high output can be realized.

As described above, according to the present invention, when the ridge extending direction is selected properly, the semiconductor laser of the surface emitting type configuration of low threshold value, high output and high efficiency can be obtained by utilizing the {110} crystal face spontaneously and selectively grown.

While V/III ratio was selected to be 87 and the growth speed was selected to be 10Å/s as the epitaxial growth conditions of the respective layers as described above, the present invention is not limited thereto and the V/III ratio may be selected to be greater than 50 and the growth speed may be greater than several 10s of Angstroms/s. A variety of conditions can selected such that the V/III ratio is selected to be about 68 and the growth speed is selected to be about 14Å/s, for example. On the other hand, when the V/III ratio is less than 50 and the growth speed is less than 10Å/s, the growth speed is increased even on the {110} crystal face, the {110} crustal face is not formed from the side portions of the ridge and epitaxially grown.

Furthermore, the present invention is not limited to the arrangements and the materials of the above-mentioned respective embodiments and can be applied to semiconductor laser of various materials and arrangements in which the conductivity type of each layer is selected to be opposite conductivity type and. InGaAs-based material and InP-based material are used as the materials of respective semiconductor layers and a manufacturing method thereof.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A light emitting element comprising:
   a substrate having a {100} crystal face having a ridge extending in a <001> crystal axis direction;
   a first cladding layer formed on said ridge;
   an active layer formed on said first cladding layer;
   a second cladding layer formed on said active layer;
   a first electrode being electrically connected to said substrate; and
   a second electrode being electrically connected to said second cladding layer.

2. The light emitting element according to claim 1, further comprising a reflector having a {110} crystal face in an opposing relation to at least one of both ends of said active layer.

3. The light emitting element according to claim 1, wherein at said first cladding layer, said active layer and said second cladding layer are triangular in cross section.

4. The light emitting element according to claim 3, further comprising a reflector having a {110} crystal face in an opposing relation to at least one of both ends of said active layer.

5. The light emitting element according to claim 3, wherein said substrate has an etching stop layer.

6. The light emitting element according to claim 3, wherein a current blocking layer is formed on both outsides of said triangle-shaped portions in cross section.

7. The light emitting element according to claim 1, further comprising second and third ridges in addition to said ridge.

8. The light emitting element according to claim 7, wherein grooves surrounded by said ridge and said second and third ridges are shallow as compared with grooves formed outside of said second and third ridges.

9. A method of manufacturing a light emitting element comprising the steps of:
   forming a hetero-structure in which an active layer is sandwiched by first and second cladding layers on a substrate having a {100} face having a ridge extending in a <001> crystal axis direction and an etching stop layer;
   removing said active layer, said first cladding layer, said second cladding Layer and said substrate until said etching stop layer is exposed to thereby form a resonation end face;
   forming a reflector having a {110} face on at least one side of said resonation end face in an opposing relation to said resonation end face; and
   forming a first electrode being electrically connected to said substrate and a second electrode being electrically connected to said second cladding layer, wherein said active layer and said first and second cladding layers are triangular in cross section and side surfaces of said triangular-shaped portion are formed of {110} crystal face.

10. A light emitting element comprising:
    a substrate having a {100} crystal face having a ridge extending in a <001> crystal axis direction;
    a first cladding layer formed on said ridge;
    an active layer formed on said first cladding layer;
    a second cladding layer formed on said active layer;
    a first electrode being electrically connected to said substrate; and
    a second electrode being electrically connected to said second cladding layer, wherein said ridge has a DBR (Distributed Bragg Reflector) layer and four surfaces of said first cladding layer, said active layer and said second cladding layer are surrounded by {110}°faces.

11. The light emitting element according to claim 10, wherein a light oscillated on said active layer is reflected on opposing two surfaces of said {110} faces and emitted to said substrate side.

12. The light emitting element according to claim 10, wherein said substrate is transparent relative to said oscillation light on said active layer.

13. The light emitting element according to claim 10, further comprising second and third ridges in addition to said ridge.

14. The light emitting element according to claim 13, wherein grooves surrounded by said ridge and said second and third ridges are shallow as compared with grooves formed outside of said second and third ridges.

* * * * *